United States Patent
Li (10) Patent No.: US 12,195,842 B2
(45) Date of Patent: Jan. 14, 2025

(54) SPUTTERING DEVICE WITH MICROWAVE HEATING MECHANISM

(71) Applicant: BEIJING NAURA MICROELECTRONICS EQUIPMENT CO., LTD., Beijing (CN)

(72) Inventor: Molin Li, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 17 days.

(21) Appl. No.: 17/740,719

(22) Filed: May 10, 2022

(65) Prior Publication Data
US 2022/0267893 A1    Aug. 25, 2022

Related U.S. Application Data

(63) Continuation of application No. PCT/CN2020/126446, filed on Nov. 4, 2020.

(30) Foreign Application Priority Data

Nov. 11, 2019  (CN) .......................... 201911094111.2

(51) Int. Cl.
*C23C 14/35* (2006.01)
*C23C 14/50* (2006.01)

(52) U.S. Cl.
CPC .......... *C23C 14/357* (2013.01); *C23C 14/351* (2013.01); *C23C 14/50* (2013.01)

(58) Field of Classification Search
CPC . C23C 14/357; C23C 14/541; C23C 14/5806; C23C 14/50
See application file for complete search history.

(56) References Cited

U.S. PATENT DOCUMENTS 5,225,245 A  *  7/1993  Ohta .................... C23C 16/46
427/249.11
5,976,257 A  *  11/1999  Kanai .................. C23C 16/46
427/571

(Continued)

FOREIGN PATENT DOCUMENTS

CN   103415910 A   11/2013
CN   104746031 A    7/2015

(Continued)

OTHER PUBLICATIONS

"Silicon Carbide" Anton Paar Wiki, 2023, https://wiki.anton-paar.com/us-en/silicon-carbide-sic/#:~:text=As%20a%20perfect%20non%2Dinvasive,phenomena%20to%20the%20reaction%20mixture. Anton Paar GmbH, p. 2 (Year: 2023).*

(Continued)

*Primary Examiner* — Karl Kurple
(74) *Attorney, Agent, or Firm* — ANOVA LAW GROUP, PLLC (57) ABSTRACT

A sputtering device includes a reaction chamber, a pin mechanism, and a microwave heating mechanism. The reaction chamber includes a base configured to carry a workpiece. The pin mechanism is arranged in the reaction chamber. The pin mechanism generates a relative ascending and descending motion with the base and lifts the workpiece from the base. The microwave heating mechanism is arranged in the reaction chamber and includes a microwave transmitter and a mobile device. The mobile device is connected to the microwave transmitter and configured to move the microwave transmitter to a position under the (Continued)

workpiece in response to the workpiece being carried by the pin mechanism to cause the microwave transmitter to emit microwaves to the workpiece to heat the workpiece.

6 Claims, 5 Drawing Sheets

(56) References Cited

U.S. PATENT DOCUMENTS

| | | | | |
|---|---|---|---|---|
| 6,098,637 | A * | 8/2000 | Parke | C23C 16/4405 |
| | | | | 118/724 |
| 10,309,005 | B2 * | 6/2019 | Kojima | C23C 16/4405 |
| | | | | 118/724 |
| 10,425,990 | B2 * | 9/2019 | Yasukawa | C23C 14/541 |
| 2011/0198212 | A1 | 8/2011 | Miki et al. | |
| 2012/0156392 | A1 * | 6/2012 | Kawarada | H01J 37/3222 |
| | | | | 977/890 |
| 2012/0231633 | A1 * | 9/2012 | Ewert | C23C 16/46 |
| | | | | 427/249.11 |
| 2013/0087309 | A1 * | 4/2013 | Volfovski | C23C 16/46 |
| | | | | 427/571 |
| 2016/0032446 | A1 * | 2/2016 | Gomi | H01J 37/3222 |
| | | | | 977/890 |
| 2016/0057812 | A1 * | 2/2016 | Yasukawa | C23C 14/541 |
| | | | | 392/416 |
| 2016/0251746 | A1 * | 9/2016 | Kojima | H10N 50/85 |
| | | | | 204/192.22 |

FOREIGN PATENT DOCUMENTS

| | | |
|---|---|---|
| CN | 105714245 A | 6/2016 |
| CN | 107227448 A | 10/2017 |
| CN | 110923642 A | 3/2020 |
| EP | 0092346 A1 | 10/1983 |
| JP | 2019112665 A | 7/2019 |
| KR | 20180126609 A | 11/2018 |
| TW | 201102455 A | 1/2011 |

OTHER PUBLICATIONS

The World Intellectual Property Organization (WIPO) International Search Report for PCT/CN2020/126456 Feb. 7, 2021 4 Pages (including translation).

* cited by examiner

SPUTTERING DEVICE WITH MICROWAVE HEATING MECHANISM

CROSS-REFERENCES TO RELATED APPLICATIONS

This application is a continuation of International Application No. PCT/CN2020/126456, filed on Nov. 4, 2020, which claims priority to Chinese Application No. 201911094111.2 filed on Nov. 11, 2019, the entire content of all of which are incorporated herein by reference.

TECHNICAL FIELD

The present disclosure generally relates to the sputtering technology field and, more particularly, to a sputtering device.

BACKGROUND

A copper interconnection process is an important process for chip back-end manufacturing in the existing technology. The copper interconnection process mainly includes firstly depositing a diffusion barrier layer in an etched channel, then depositing a copper seed layer, and finally forming copper interconnection lines by filling the channel through electroplating. However, as a chip feature size shrinks (20 nanometers or less), a depth-width ratio of a via (or trench) will be increased to 3.8:1. The depth-width ratio of a via (via) between some layers may reach 7:1 or higher. When the copper seed layer is deposited by the physical vapor deposition (PVD) method, a growth rate of copper is faster at a trench opening, which will cause a protrusion overhanging at a top of the trench. Thus, in a subsequent electroplating process, the trench opening may be sealed in advance, which causes the trench unable to be completely filled to form a hollow hole. Therefore, a resistance of an interconnection copper wire may be affected to affect chip electrical performance and even cause a failure.

A copper reflow technology as a process to solve a problem of realizing the chip feature size under 20 nm attracts attention. Under a high temperature (usually above 300° C.), surface mobility and grain agglomeration of PVD-deposited copper may be enhanced. With a diffusion effect and a capillary action of an etched channel, copper atoms on a surface of a deposited copper film may migrate and flow into a bottom of an etched deep hole, which may avoid forming the hollow hole. Moreover, the entire reflow process may include a plurality of steps that are cycled during the process. A number of cycles depends on a filling structure, so as to completely fill the deep hole.

A PVD apparatus used in the copper reflow technology of the existing technology generally includes a circular reaction chamber, a support base arranged in the reaction chamber and configured to carry a wafer, and a target arranged above the support base. During sputtering, a direct current (DC) power source may apply DC power to the target to make the target have a negative voltage relative to the grounded reaction chamber to cause a reaction gas (e.g., argon) to discharge to generate a plasma. Positively charged argon ions may be attracted to the target having the negative voltage. When the energy of the argon ions is high enough, a metal atom may escape from the target surface and be deposited on the wafer.

In order to satisfy a temperature requirement of the copper reflow process, a heating lamp is usually added to the reaction chamber to heat the wafer in a thermal radiation manner after the film deposition process is completed. However, heating efficiency of the heating method is low, which causes a temperature rise rate of the wafer to be slow and longer cycle time (above 30 mins) of the reflow process. If a plurality of reflow processes may need to be cycled, longer time may be needed, which significantly affects the yield.

SUMMARY

Embodiments of the present disclosure provide a sputtering device, including a reaction chamber, a pin mechanism, and a microwave heating mechanism. The reaction chamber includes a base configured to carry a workpiece. The pin mechanism is arranged in the reaction chamber. The pin mechanism generates a relative ascending and descending motion with the base and lifts the workpiece from the base. The microwave heating mechanism is arranged in the reaction chamber and includes a microwave transmitter and a mobile device. The mobile device is connected to the microwave transmitter and configured to move the microwave transmitter to a position under the workpiece in response to the workpiece being carried by the pin mechanism to cause the microwave transmitter to emit microwaves to the workpiece to heat the workpiece.

The sputtering device of embodiments of the present disclosure may have at least the following advantages.

The sputtering device of embodiments of the present disclosure emits the microwaves to the workpiece (wafer) that is to be processed through the microwave transmitter. The microwave directly acts on the polar molecules in the workpiece (wafer) that is to be processed to heat the workpiece that is to be processed. The heating rate of the workpiece that is to be processed is fast. At the same time, the metal film deposited by sputtering on the surface of the workpiece that is to be processed can effectively reflect the microwaves emitted from below and return it to the workpiece that is to be processed. Thus, the microwave utilization efficiency and the heating efficiency may be further improved so that the temperature of the workpiece that is to be processed may rise quickly to realize the reflow process. As such, the reflow process cycle time may be effectively shortened, and the production efficiency may be improved.

BRIEF DESCRIPTION OF THE DRAWINGS

In order to illustrate the technical solutions in the embodiments of the present invention more clearly, the following briefly introduces the accompanying drawings used in the description of the embodiments. Obviously, the accompanying drawings in the following description are only some embodiments of the present invention. For those of ordinary skill in the art, other drawings can also be obtained from these drawings without creative effort.

DETAILED DESCRIPTION OF THE EMBODIMENTS

In order to make the objectives, technical solutions, and advantages of the present disclosure clearer, embodiments of the present disclosure are further described in detail below in connection with the accompanying drawings.

Figure 1:
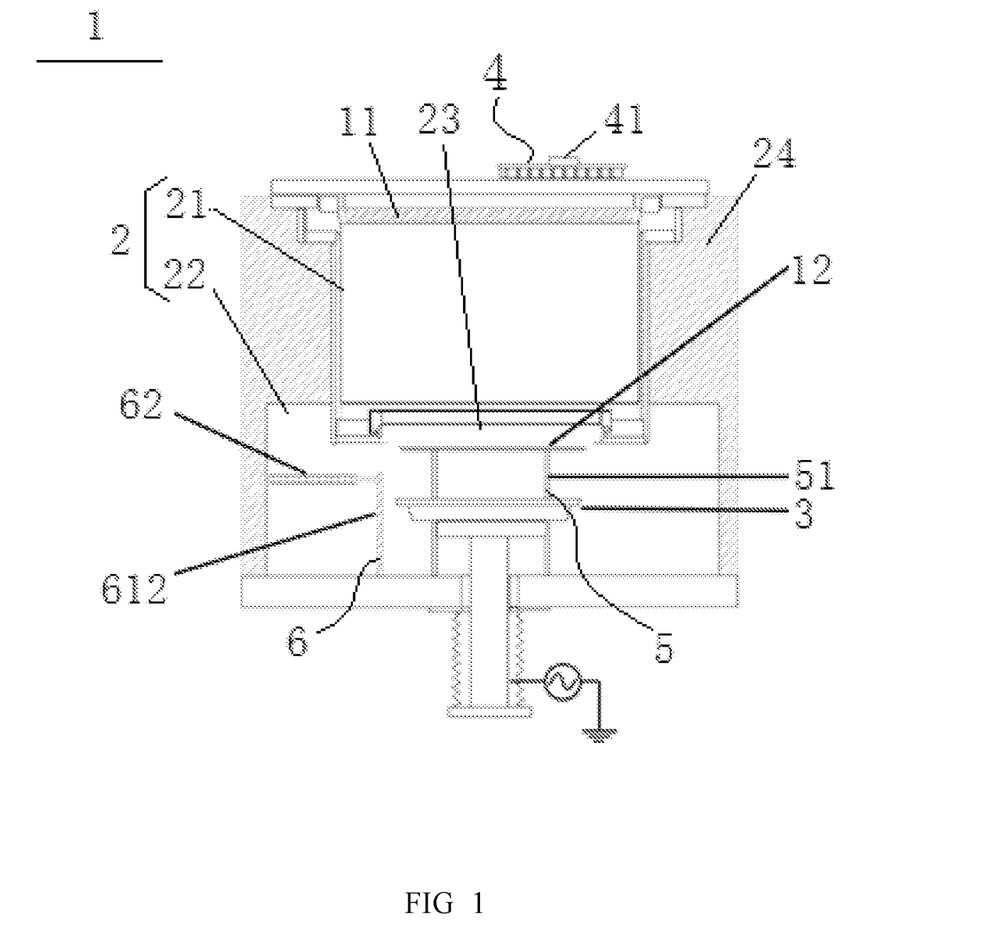
FIG. 1 is a schematic structural diagram of a sputtering device according to some embodiments of the present disclosure.

In embodiments of the present disclosure, FIG. 1 is a schematic structural diagram of a sputtering device 1 according to some embodiments of the present disclosure. The sputtering device 1 may be configured to perform a sputtering process and a reflow process on a workpiece 12 that is to be processed. During the sputtering process, particles (e.g., ions or neutral atoms, molecules) with certain energy may be generated in a plasma generated in a reaction chamber 2. The particles may bombard a surface of a target 11 so that atoms or molecules near to the surface of the target 11 may obtain sufficient energy to escape from the surface of the target 11 and be deposited on a workpiece 12 that is to be processed to form a film covering the workpiece 12 that is to be processed. The workpiece 12 that is to be processed may include a wafer, but is not limited here.

In some embodiments, the sputtering device 1 includes the reaction chamber 2, a base 3, a pin mechanism 5, and a microwave heating mechanism 6. The reaction chamber 2 may be configured to provide an accommodation space for the sputtering process and the reflow process of the workpiece 12 that is to be processed. Referring to FIG. 1 again, in some embodiments, the reaction chamber 2 includes a sputtering chamber 21 and an accommodation chamber 22. The target 11 may be arranged at a top of the sputtering chamber 21. The target 11 may include a sputtering material, such as copper (Cu), tantalum (Ta), titanium (Ti), or aluminum (Al), but not limited to this.

A sputtering mechanism 4 may be arranged at a top of the sputtering chamber 21, which may be applied on the target 11. The sputtering mechanism 4 may be configured to perform the sputtering process on the workpiece 12 that is to be processed. In some embodiments, the sputtering mechanism 4 includes a magnetron 41 and a DC power source (not shown in the drawing). The magnetron 41 is arranged at the back of the target 11, which is not limited. In some embodiments, no special requirement may be needed for selecting the magnetron 41, which can be selected with reference to a conventional selection. Referring to FIG. 1 again, the reaction chamber 2 is grounded, the DC power source is connected to the target 11 in the reaction chamber 2 (sputtering chamber 21). The DC power source may be configured to apply a bias voltage to the target 11.

When the sputtering mechanism 4 sputters, the DC power source applies a bias voltage to the target 11 to make the target 11 have a negative voltage relative to the grounded reaction chamber 2. Thus, the reaction gas (e.g., argon) in the reaction chamber 2 may be discharged to generate the plasma. The positively charged argon ions may be attracted to the target 11 having the negative voltage. When the energy of the argon ions is high enough, the metal atoms may escape from the surface of the target 11, move downward, and be deposited on an upper surface of the workpiece 12 that is to be processed to form a metal film covering the workpiece 12 that is to be processed to complete the magnetron sputtering process. In practical applications, the structure of the sputtering mechanism 4 may not be limited here. Those skilled in the art may also select another suitable type of sputtering process according to an actual sputtering requirement.

The accommodation chamber 22 is located below the sputtering chamber 21. For example, the accommodation chamber 22 may be coaxially arranged with the sputtering chamber 21. A via 23 is formed between the accommodation chamber 22 and the sputtering chamber 21. The via 23 may be configured to cause the accommodation chamber 22 to communicate with the sputtering chamber 21. Thus, the workpiece 12 that is to be processed may move between the accommodation chamber 22 and the sputtering chamber 21 through the via 23.

The structure of the reaction chamber 2 is not limited here. In practical applications, those skilled in the art may also select the reaction chamber 2 with another suitable structure according to embodiments of the present disclosure.

In some embodiments, the sputtering chamber 21 and the accommodation chamber 22 may be defined by a same chamber 24. The chamber 24 may be usually a ring-shaped reaction chamber, but is not limited here.

In some embodiments, the base 3 is arranged in the reaction chamber 2. In some embodiments, the base 3 is arranged in the accommodation chamber 22 and at a position corresponding to the via 23. The base 3 may be configured to carry the workpiece 12 that is to be processed. In addition, the base 3 may be retractable so as to be able to rise into the sputtering chamber 21 through the via 23. Thus, the workpiece 12 that is to be processed may be directly located under the target 11 for the sputtering process. After the sputtering process is performed on the workpiece 12 that is to be processed, the base 3 may be lowered into the accommodation chamber 22 through the via 23. Thus, the workpiece 12 that is to be processed may return to the accommodation chamber 22 for the reflow process. The base 3 may be made of ceramic material, but is not limited here.

Referring to FIG. 1 again, the pin mechanism 5 is arranged in the reaction chamber 2. The pin mechanism 5 may generate a relative lifting motion with the base 3 to lift up from the base 3 and carry the workpiece 12 that is to be processed. At this time, the workpiece 12 that is to be processed is located above the base 3. Thus, the microwave heating mechanism 6 may move to a position under the workpiece 12 that is to be processed to perform heating. In some embodiments, the relative lifting motion generated by the pin mechanism 5 with the base 3 may be realized in two methods. One method is that both the pin mechanism 5 and the base 3 may be raised and lowered. The other method is that the pin mechanism 5 is fixed, and the base 3 may be raised and lowered. With both methods, the pin mechanism 5 may be lifted up from the base 3 and carry the workpiece 12 that is to be processed, so that the workpiece 12 that is to be processed may be located above the base 3.

In some embodiments, the pin mechanism 5 may include a plurality of pins 51. The plurality of pins 51 may pass through the base 3. That is, the plurality of pins may be accommodated in the base 3. However, the arrangement of the plurality of pins 51 is not limited here. Those skilled in the art may also select another suitable setting method according to embodiments of the present disclosure. For example, the plurality of pins 51 may also be arranged under the base 3. When the reflow process is performed on the workpiece 12, the plurality of pins 51 may pass through the base 3 to lift the workpiece 12 that is to be processed from the base 3 and carry the workpiece 12 that is to be processed. In addition, the plurality of pins 51 may pass through the base 3 by raising the plurality of pins to pass through the base 3, or by fixing the plurality of pins 51 while lowering the base 3 to cause the plurality of pins 51 to pass through the base 3.

In some embodiments, the plurality of pins 51 may be made of a material that can absorb microwaves, such as ceramics. A metal material may reflect microwaves. If the plurality of pins 51 are made of the metal material, when the plurality of pins 51 are in contact with the workpiece 12 that is to be processed, contact positions between the plurality of pins 51 and the workpiece 12 that is to be processed may absorb microwaves. Thus, the workpiece 12 that is to be processed may be unevenly heated. Therefore, the plurality of pins 51 may be made of the material that can absorb microwaves to avoid uneven temperature rise at the contact positions between the plurality of pins 51 and the workpiece 12 that is to be processed.

Figure 3:
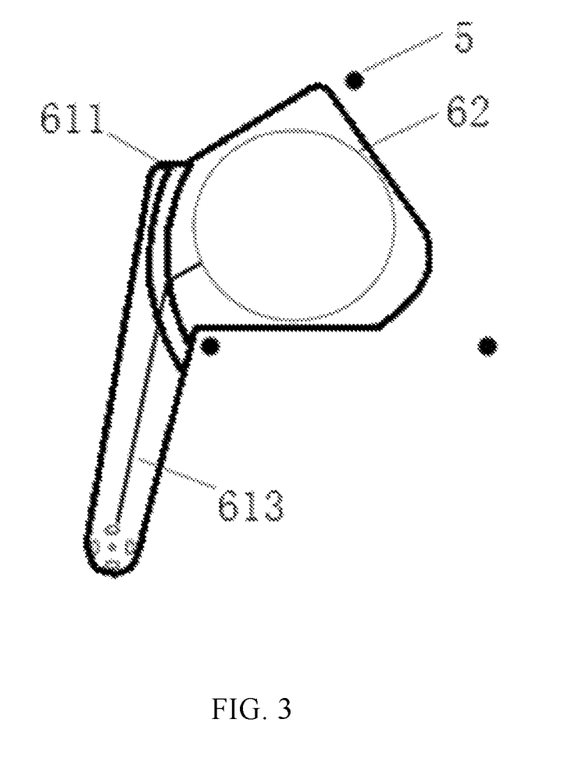
FIG. 3 is a schematic top view of a microwave transmitter embedded in a transmission arm and a plurality of pins according to some embodiments of the present disclosure.

The plurality of pins 51 may be arranged in a plurality of manners. For example, FIG. 3 is a schematic top view of a microwave transmitter 62 embedded in a transmission arm 611 and a plurality of pins 51 according to some embodiments of the present disclosure. A number of the pins 51 is three. When the transmission arm 611 is located above the base 3, the three pins 51 are all located around the transmission arm 611 and are distributed at positions near an edge of the workpiece 12 that is to be processed. The three pins 51 are distributed in a circumferential direction at an interval to support the workpiece 12 that is to be processed stably. In practical applications, the number of the pins 51 may be set as needed, for example, four, five, or more than five. The distribution of the pins 51 may be set.

Figure 2:
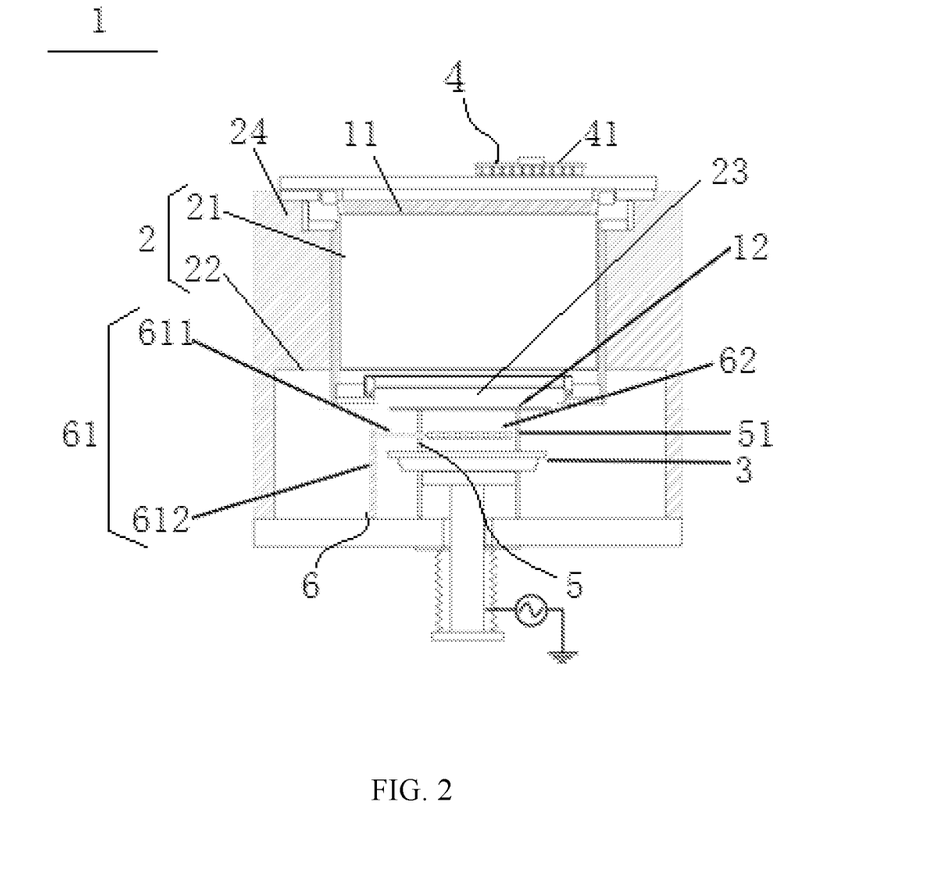
FIG. 2 is a schematic structure diagram of a sputtering device when a workpiece that is to be processed is heated according to some embodiments of the present disclosure.

The microwave heating mechanism 6 may be arranged in the reaction chamber 2. Referring to FIG. 1 again, in some embodiments, the microwave heating mechanism 6 is arranged in the accommodation chamber 22. FIG. 2 is a schematic structure diagram of the sputtering device 1 when the workpiece 12 that is to be processed is heated according to some embodiments of the present disclosure. The microwave heating mechanism 6 includes a mobile device 61 and a microwave transmitter 62. The microwave transmitter 62 is connected to the mobile device 61. The mobile device 61 may be configured to move the microwave transmitter 62 to the position under the workpiece 12 that is to be processed when the workpiece 12 is carried by the pin mechanism 5 after the sputtering process. The microwave transmitter 62 may be configured to emit microwaves to the workpiece 12 that is to be processed to heat the workpiece 12 that is to be processed until the temperature required for the reflow process is reached. The microwaves emitted by the microwave transmitter 62 usually refer to electromagnetic waves with a frequency of 300 MHz-300000 MHz and a wavelength of less than 1 m.

The microwave transmitter 62 is not limited to be applied to the reflow process after magnetron sputtering shown in the above embodiments, but also may be applied to a reflow process after another sputtering process. In some embodiments, no special requirement may be required to select the microwave transmitter 62, which may be selected according to the conventional selection.

In some embodiments, referring to FIG. 1 and FIG. 2, the mobile device 61 includes a transmission arm 611 and a rotation arm 612. The rotation arm 612 is vertically arranged in the reaction chamber 2 (the accommodation chamber 22) and is located on a side of the base 3. The rotation arm 612 may rotate around an axis of the rotation arm 612. A rotation angle may be 90°, but it is not limited here. Those skilled in the art may also choose to set the corresponding rotation angle according to an actual situation. In addition, the rotation arm 612 may be usually driven by a stepping motor (not shown in the drawing) and a corresponding drive structure (e.g., a transmission gearbox, etc.) to rotate, which is not limited here. Those skilled in the art may also select another suitable drive manner according to common sense.

An end of the transmission arm 611 is connected to the rotation arm 612. Thus, the transmission arm 611 may be driven to rotate around the axis of the rotation arm 612 during rotation. In some embodiments, the transmission arm 611 is vertically connected to the rotation arm 612 through a bolt connection or a welding connection, which is not limited here. In addition, as shown in FIG. 3, the structure of the transmission arm 611 and the distribution of the pins 51 cooperate with each other. Thus, the transmission arm 611 does not collide with the pin mechanism 5 during the rotation of the transmission arm 611 along a rotation path of the transmission arm 611.

Referring to FIG. 3 again, the microwave transmitter 62 is arranged at the transmission arm 611, which can be embedded to be fixed at the transmission arm 611. For example, an embedded groove may be arranged at the transmission arm 611 to fix the microwave transmitter 62 in the embedded groove, which is not limited. In embodiments of the present disclosure, an electrical connection wire of the microwave transmitter 62 may be led out of the reaction chamber 2 through the rotation arm 612 to realize a connection to an external controller, which is not limited here.

Figure 4:
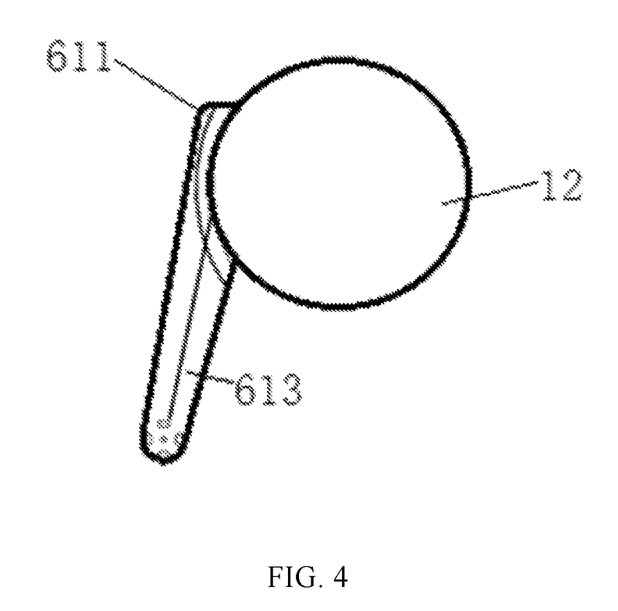
FIG. 4 is a schematic top view showing a microwave being moved to a position under a workpiece that is to be processed according to some embodiments of the present disclosure.

FIG. 4 is a schematic top view showing the microwave transmitter 62 being moved to a position under the workpiece 12 that is to be processed according to some embodiments of the present disclosure. The rotation of the transmission arm 611 may drive the microwave transmitter 62 to rotate, such that the microwave transmitter 62 may move to the position under the workpiece 12 that is to be processed. The microwave transmitter 62 may emit microwaves to the workpiece 12 that is to be processed to heat the workpiece 12 that is to be processed. However, the structure of the mobile device 61 is not limited here. Those skilled in the art can also select another suitable structure of the mobile device 61 according to embodiments of the present disclosure.

Since the microwaves emitted by the microwave transmitter 62 may damage the base 3 made of the ceramic material, the transmission arm 611 of embodiments of the present disclosure is made of the metal material to reflect the microwaves and protect the base 3. The temperature of the transmission arm 611 made of the metal material rises quickly, and the temperature is relatively high. The microwave transmitter 62 is arranged at the transmission arm 611. The temperature of the microwave transmitter 62 will be too high under a long-term operation, which may cause the failure of the microwave transmitter 62. In order to solve this problem, referring to FIG. 3 and FIG. 4 again, a cooling device is also arranged at the transmission arm 611 to cool the microwave transmitter 62. The cooling device may include various structures. For example, the cooling device may include a cooling water channel 613 arranged in the transmission arm 611 to cool the microwave transmitter 62 by using water cooling.

Figure 5:
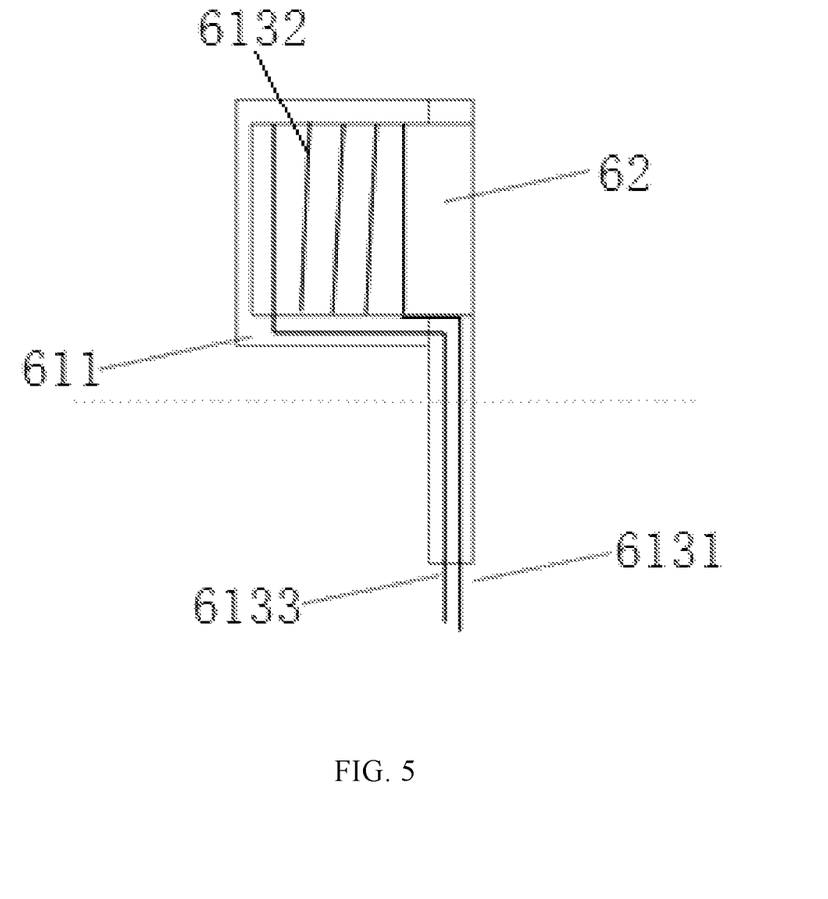
FIG. 5 is an arrangement diagram showing a cooling water channel in a transmission arm according to some embodiments of the present disclosure.

In some embodiments, FIG. 5 is an arrangement diagram showing a cooling water channel 613 in the transmission arm 611 according to some embodiments of the present disclosure. The cooling water channel 613 includes a water inlet pipeline 6131, a cooling pipeline 6132, and a water outlet pipeline 6133. The water inlet pipeline 6131 and the water outlet pipeline 6133 are both arranged in the transmission arm 611. Two ends of the cooling pipeline 6132 communicate with the water inlet pipeline 6131 and the water outlet pipe 6133, respectively. Water exchange may be performed on the cooling pipe 6132 in real-time through the water inlet pipe 6131 and the water outlet pipe 6133. The cooling pipe 6132 is spirally arranged around at the microwave transmitter 62. A contact area between the cooling pipeline 6132 and the microwave transmitter 62 may be increased due to the spiral arrangement of the cooling pipeline 6132. Thus, the water cooling efficiency may be increased. However, the present disclosure is not limited to this.

The sputtering device 1 of embodiments of the present disclosure may be applied to the PVD apparatus and configured to perform the sputtering process and the reflow process in the PVD process. Referring to FIG. 1 again, during the sputtering process, the target 11 may be mounted and fixed at the top of the reaction chamber 2 (sputtering chamber 21). The workpiece 12 that is to be processed may be arranged on the base 3. The base 3 may drive the workpiece 12 that is to be processed to rise into the sputtering chamber 21. The sputtering mechanism 4 may act on the target 11 to cause the metal atoms or molecules on the surface of the target 11 to escape, move downward, and be deposited at the workpiece 12 that is to be processed to form a metal film covering the workpiece 12.

After the sputtering process, the base 3 may drive the workpiece 12 that is to be processed to descend to the accommodation chamber 22 for the reflow process. The pin mechanism 5 may lift the workpiece 12 that is to be processed from the base 3 and carry the workpiece 12 that is to be processed. Referring to FIG. 2 again, the rotation arm 612 drives the transmission arm 611 to rotate around the axis of the rotation arm 612 to rotate the microwave transmitter 62 to the position under the workpiece 12 that is to be processed. Then, the microwave transmitter 62 may be controlled to emit the microwaves facing the back of the workpiece 12 that is to be processed. The microwaves may directly act on polar molecules of the workpiece 12 that is to be processed to heat the workpiece 12 that is to be processed. Meanwhile, the metal film deposited by sputtering on the upper surface of the workpiece 12 that is to be processed may effectively reflect the microwaves emitted under the workpiece 12 that is to be processed to make it return to the workpiece 12 that is to be processed. Thus, microwave utilization efficiency may be further improved to improve the heating efficiency. Therefore, the temperature of the workpiece 12 that is to be processed may rise rapidly to realize the reflow process, thereby effectively shortening the reflow process cycle time and improving production efficiency.

The above description shows and describes embodiments of the present disclosure, but as previously mentioned, the present disclosure should not be limited to the form disclosed in the specification. The above embodiments should not be regarded as an exclusion of other embodiments, but may be used in other combinations, modifications, and environments. Embodiments of the present disclosure may be modified within the scope of the concept scope of the present disclosure through the above teachings or from the technology or knowledge in the relevant field. However, modifications and changes made by those skilled in the art do not depart from the spirit and scope of the present invention and should be within the scope of the appended claims of the present invention.

What is claimed is:

1. A sputtering device configured to perform a sputtering process on a to-be-processed workpiece comprising:
    a reaction chamber;
    a base arranged in the reaction chamber and configured to carry a workpiece;
    a sputtering mechanism arranged on the reaction chamber and configured to perform the sputtering process on the to-be-processed workpiece;
    a pin mechanism arranged in the reaction chamber and configured to lift the to-be-processed workpiece from the base and carry the to-be-processed workpiece when a reflow process is performed on the to-be-processed workpiece; and
    a microwave heating mechanism arranged in the reaction chamber and including:
        a microwave transmitter being of a circular shape and with a diameter smaller than that of the workpiece;
        a moving device including:
            a rotation arm vertically arranged in the reaction chamber and located on a side of the base;
            a transmission arm connected to the rotation arm and driven by the rotation arm, the microwave transmitter being arranged at the transmission arm, connected to the microwave transmitter and configured to move the microwave transmitter to a position under the workpiece and above the base with a portion of the moving device being located between the workpiece and the base in response to the workpiece being lifted by the pin mechanism to cause the microwave transmitter to emit microwaves facing a back of the workpiece to act on polar molecules of the workpiece; and
        an electrical connection wire of the microwave transmitter is led out of the reaction chamber through the rotation arm;
    wherein:
        the pin mechanism includes a plurality of pins accommodated in the base and extend out of the base to lift the to-be-processed workpiece from the base and carry the to-be-processed workpiece when the reflow process is performed on the to-be-processed workpiece, the plurality of pins being made of a material that absorbs microwaves; and
        the moving device comprises a structure that cooperates with a distribution of the plurality of pins such that, during a rotation of the moving device, the portion of the moving device does not collide with the plurality of pins, and the pins are located around an outer side of the portion of the moving device when the portion of the moving device is located between the workpiece and the base.

2. The sputtering device of claim 1, wherein the reaction chamber includes:
    a sputtering chamber configured to perform the sputtering process on the to-be-processed workpiece; and
    an accommodation chamber located under the sputtering chamber and arranged co-axially with the sputtering chamber, the microwave heating mechanism being arranged in the accommodation chamber and configured to perform the reflow process on the to-be-processed workpiece, wherein:
        a via is formed between the accommodation chamber and the sputtering chamber;
        the base is arranged in the accommodation chamber and corresponding to the via; and in response to performing the sputtering process on the to-be-processed workpiece, the base is ascended into the sputtering chamber through the via, and after performing the sputtering process on the to-be-processed workpiece, the base is descended into the accommodation chamber through the via to perform the reflow process on the to-be-processed workpiece.

3. The sputtering device of claim 2, wherein the sputtering mechanism includes:
a target arranged at a top of the reaction chamber;
a magnetron arranged at a back of the target; and
a direct current (DC) power source connected to the target and configured to apply a voltage to the target.

4. The sputtering device of claim 1, wherein:
the plurality of pins are made of ceramics.

5. The sputtering device of claim 1, wherein:
the transmission arm is made of a metal material; and
a cooling water channel is arranged in the transmission arm and configured to cool the microwave transmitter.

6. The sputtering device of claim 5, wherein the cooling water channel includes:
a water inlet pipeline arranged in the transmission arm;
a water outlet pipeline arranged in the transmission arm; and
a cooling pipeline spirally arranged around the microwave transmitter, two ends of the cooling pipeline communicating with the water inlet pipeline and the water outlet pipeline, respectively.

* * * * *